United States Patent [19]

Heo et al.

[11] Patent Number: 5,712,570
[45] Date of Patent: Jan. 27, 1998

[54] METHOD FOR CHECKING A WIRE BOND OF A SEMICONDUCTOR PACKAGE

[75] Inventors: Young Wok Heo, Seoul; Dong Sin Youm, Kyungki-Do, both of Rep. of Korea

[73] Assignees: ANAM Industrial Co., Ltd., Rep. of Korea; Amkor Electronics, Inc., Pa.

[21] Appl. No.: 530,558

[22] Filed: Sep. 19, 1995

[30] Foreign Application Priority Data

Sep. 27, 1994 [KR] Rep. of Korea ............... 94-24280

[51] Int. Cl.$^6$ ............................................. G01R 31/04
[52] U.S. Cl. ............................................. 324/538; 324/537
[58] Field of Search ........................... 324/522, 523, 324/527, 537, 538, 555, 691, 713, 715, 718, 719, 722; 228/103, 104

[56] References Cited

U.S. PATENT DOCUMENTS

| | | | |
|---|---|---|---|
| 3,975,680 | 8/1976 | Webb | 324/537 X |
| 4,056,773 | 11/1977 | Sullivan | 324/537 X |
| 4,186,338 | 1/1980 | Fichtenbaum | 324/537 X |
| 4,563,636 | 1/1986 | Snook et al. | 324/538 X |
| 5,059,897 | 10/1991 | Aton et al. | 324/538 |
| 5,124,660 | 6/1992 | Cilingiroglu | 324/538 |
| 5,254,953 | 10/1993 | Crook et al. | 324/538 |
| 5,275,058 | 1/1994 | Pham et al. | 324/538 X |
| 5,489,851 | 2/1996 | Heumann et al. | 324/537 |
| 5,557,209 | 9/1996 | Crook et al. | 324/537 |

*Primary Examiner*—Ernest F. Karlsen
*Assistant Examiner*—Diep Do
*Attorney, Agent, or Firm*—Skjerven Morrill MacPherson Franklin & Friel; Thomas S. MacDonald

[57] ABSTRACT

A method for checking wire bonding result of a ball grid array (BGA) package is disclosed. An electroconductive metal layer of gold or copper is grounded on a chip bonding portion of a printed circuit board (PCB) of the BGA package as well as on a passage extending between the chip bonding portion and the gate of the PCB. After a wire bonding step, a probe and a capillary of a wire bonding checking system contact with the gate and with a semiconductor chip respectively. Thereafter, an electric current is sent to the BGA package from the checking system so as to check whether the BGA package sends the electric current therethrough. When there is neither a lift bond nor a missing wire in the BGA package, the package will send the current. However, when there is either a lift bond or the missing wire in the BGA package, the package will not send the current.

8 Claims, 3 Drawing Sheets

5,712,570

METHOD FOR CHECKING A WIRE BOND OF A SEMICONDUCTOR PACKAGE

BACKGROUND OF THE INVENTION

1. Field of the Invention

The present invention relates in general to a wire bonding checking method for a ball grid array (BGA) package and, more particularly, to an improvement in such a checking method for checking either a lift bond or a missing wire of wire-bonded BGA package during the BGA package production procedure, which BGA package uses a printed circuit board as its lead frame.

2. Description of the Prior Art

Conventionally, a semiconductor chip paddle of a copper alloy lead frame acts as an electric ground, so that a lift bond, which means the wire-bonded points are totally or partially separated from or coming off the pads or posts on the chip and leads and a missing wire, which means wires missed in the wire bonding step are checked by a wire bonding checking system during the step for bonding wires to the semiconductor chip and to the leads of the lead frame. That is, in order to check either a lift bond or a missing wire of the package having a typical lead frame, probe and capillary of the wire bonding checking system contact with the chip paddle of the package and with the semiconductor chip bonded to the chip paddle using epoxy. In this state, an electric current is sent to the package, thus to check whether the package sends the current therethrough. However, the chip bonding section of a BGA package using a printed circuit board (PCB) as its lead frame is an isolated section of the PCB which can not send the electric current therethrough, so that a lift bond or a missing wire of the BGA package is not checked using the conventional checking system, but visually checked by human eyes. However, the visual checking of wire bonding result can not achieve desired accuracy of the wire bonding checking result. Moreover, the visual checking causes waste of labor, waste of matter and waste of time, thus to deteriorate productivity and operational reliability of the BGA packages.

SUMMARY OF THE INVENTION

It is, therefore, an object of the invention to provide a method for checking a wire bonding result of a BGA package in which the above problems can be overcome and which comprises a step of forming an electroconductive metal layer on a chip bonding portion of a PCB of the BGA package as well as on a passage between the chip bonding portion and a gate, the gate being provided on the PCB for letting a molded housing of the BGA package be readily separated from molds after molding the housing using compound resin, a step for contacting a probe and a capillary of a wire bonding checking system to the gate and to a semiconductor chip respectively, the semiconductor chip being bonded to the chip bonding portion of the PCB and interconnected to leads of the PCB by means of wires bonded to the chip and to the leads, and a step for sending an electric current to the BGA package from the checking system and checking whether the BGA package sends the electric current therethrough.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
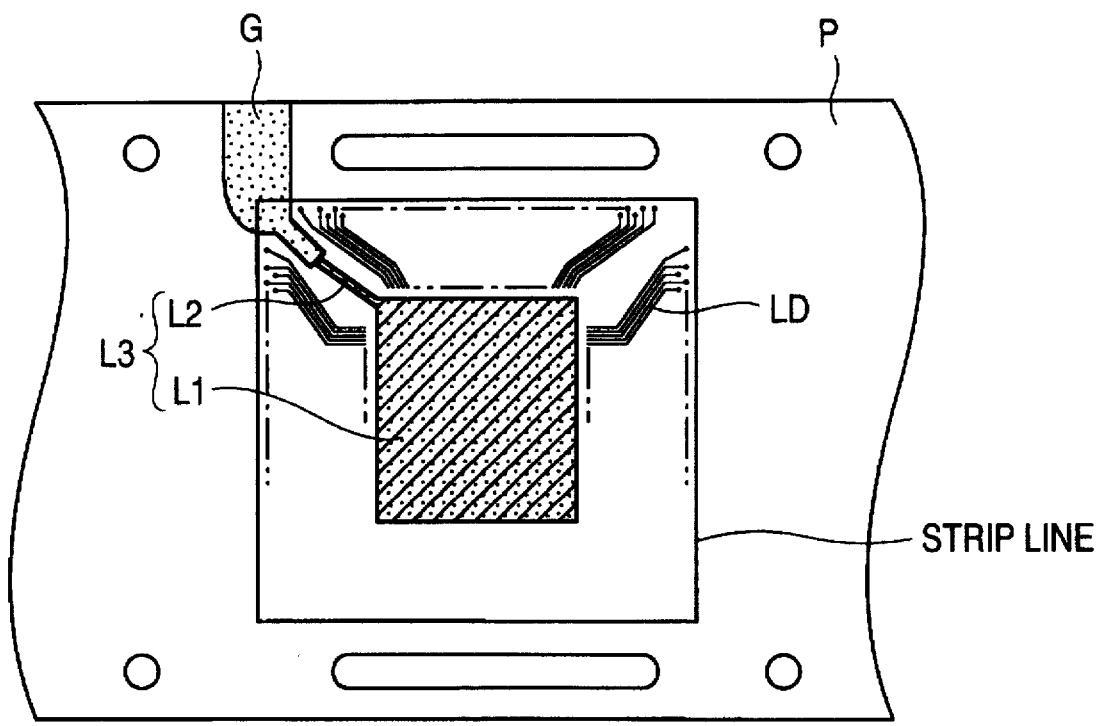
FIG. 1 is a plan view of a BGA package of the invention, having a PCB as its lead frame.

With reference to FIG. 1, there is shown in a plan view a BGA package of the invention, which package has a PCB (P) as its lead frame. As shown in this drawing, the PCB (P) printed with circuit is provided with a plurality of leads LD. The inside ends of the leads LD are concentrated to the center portion L1 of the PCB, which center portion L1 is for mounting a semiconductor chip C thereon. In the invention, the center portion L1 is grounded with an electroconductive metal layer L3 such as a gold layer or a copper layer.

The electroconductive metal layer L3 is also grounded on a passage L2 between a gate G and the center portion L1, which gate G is formed on a side of the PCB for causing good separation of a resin-molded housing of the BGA package from molds after molding the housing using a compound resin. That is, the electroconductive metal layer L3 is formed on the center portion L1 as well as on the passage L2.

Figure 2:
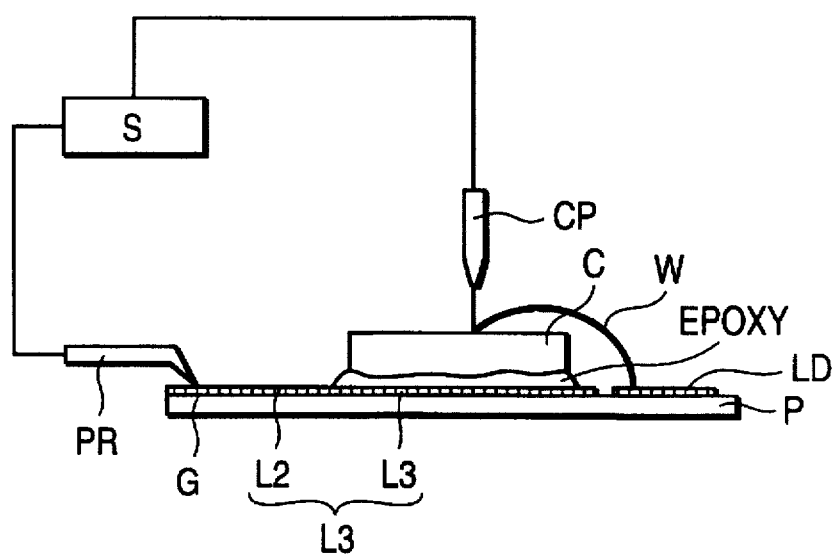
FIG. 2 is a side view showing a checking operation for the wire bonding result of the BGA package of the invention.

The chip bonding step for bonding the semiconductor chip. C to the top surface of the electroconductive metal layer L3 on the center portion L1 is followed by a wire bonding step for interconnecting the chip C to the leads LD by means of wires W which are bonded to the chip C and to the leads LD. After the wire bonding step, the wire bonding result is checked through a method of the invention. In order to check the wire bonding result of the BGA package, a probe PR of a wire bonding checking system S of the invention contacts with the gate G of the PCB, while a capillary CP of the system S contacts with the top surface of the semiconductor chip C as shown in FIG. 2.

When sending an electric current to the BGA package under the condition that the probe PR and the capillary CP of the wire bonding checking system S contacts with the gate G and with the semiconductor chip C respectively as described above, it is possible to check whether either a lift bond or a missing wire is in the BGA package. That is, when there is neither a lift bond nor a missing wire in the BGA package, the package will send the electric current therethrough as the electroconductive metal layer L3 of gold or copper is grounded on the center portion L1 as well as on passage L2 extending from the portion L1 to the gate G. On the contrary, when there is either for a lift bond or for a missing wire in the BGA package, the package will not send the current therethrough.

In the present invention, the electroconductive metal layer L3 is made of gold or copper having good electroconductivity, thus to improve the checking effect of the checking system S. The metal layer L3 also causes no trouble on the electric performance of the circuit of the BGA package.

Figure 3:
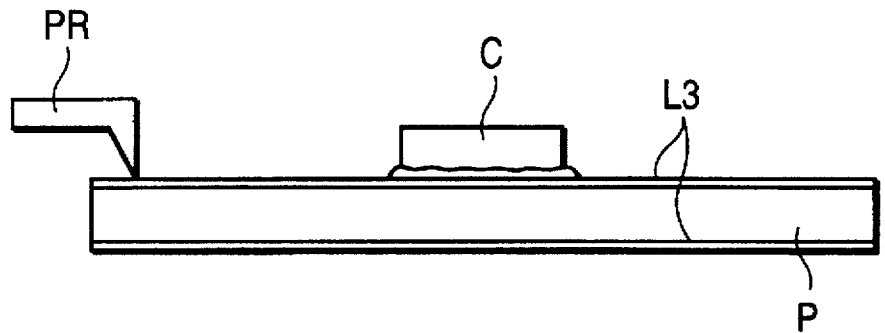
FIG. 3 is a side view showing a checking operation for the wire bonding result of a BGA package having a single-layered PCB in accordance with an embodiment of the invention.

In an embodiment of the invention, the wire bonding result checking method is used for checking for a lift bond or for a missing wire of a BGA package having a single-layered PCB. In this case, the single-layered PCB which will have the chip C thereon is grounded with the electroconductive metal layer L3 of gold or copper as shown in FIG. 3.

Figure 4:
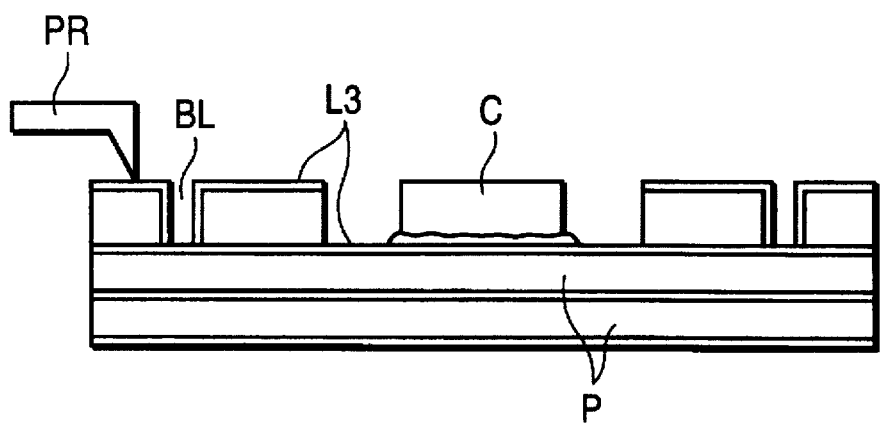
FIG. 4 is a side view showing a checking operation for the wire bonding result of a BGA package having a multi-layered PCB with a blind via in accordance with another embodiment of the invention.

In another embodiment of the invention, the wire bonding result checking method is used for checking for a lift bond or for a missing wire of a BGA package having a multi-layered PCB together with a blind via BL. In this case, the electroconductive metal layer L3 of gold or copper is grounded on the multi-layered PCB having the blind via BL as shown in FIG. 4.

Figure 5:
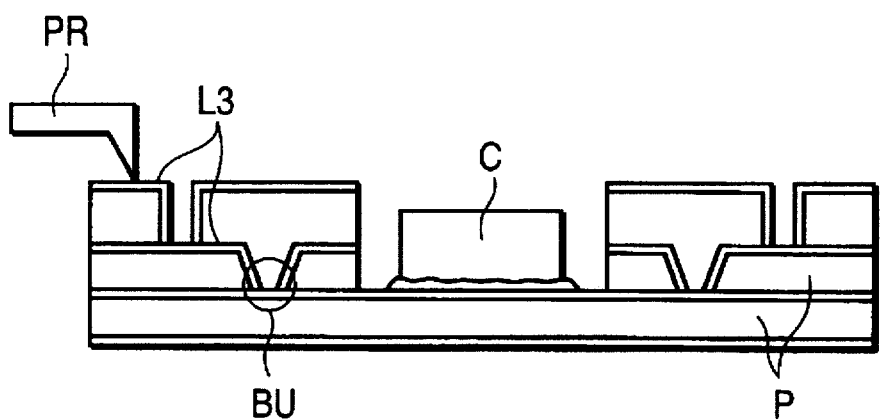
FIG. 5 is a side view showing a checking operation for the wire bonding result of a BGA package having a multi-layered PCB with a buried via in accordance with still another embodiment of the invention.
Figure 6:
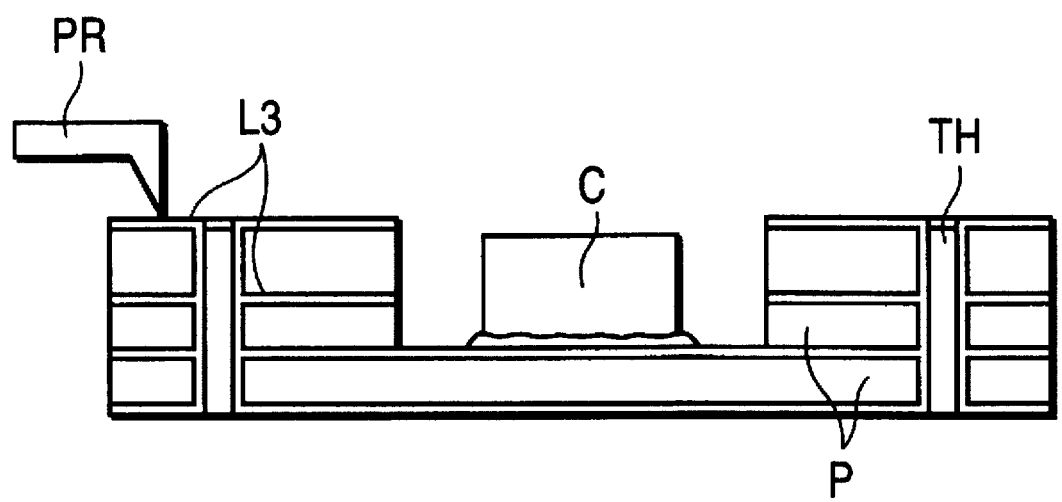
FIG. 6 is a side view showing a checking operation for the wire bonding result of a BGA package having a multi-layered PCB with a through hole in accordance with further embodiment of the invention.

The wire bonding result checking method of the invention may be used for checking for a lift bond or for a missing wire of a BGA package having a multi-layered PCB together with either a buried via BU or a through hole TH. In this case, the electroconductive metal layer L3 of gold or copper is grounded on a chip bonding portion of the multi-layered PCB having either the buried via BU or the through hole TH as shown in FIGS. 5 and 6.

As described above, in a wire bonding result checking method for a BGA package of the invention, an electroconductive metal layer is grounded on a chip bonding portion of a PCB of the package as well as on a passage extending between the chip bonding portion and a gate, which gate is formed on the PCB for causing good separation of a molded housing of the BGA package from molds after molding the housing using a compound resin. In order to check for a lift bond or for a missing wire of the BGA package through the method of the invention after the wire bonding step, a probe and a capillary of a wire bonding checking system contact with the gate and with the top surface of a semiconductor chip bonded to the chip bonding portion of the PCB respectively. The checking system sends an electric current to the BGA package so as to check whether the package sends the current therethrough. When there is neither a lift bond nor a missing wire in the BGA package, the package will send the current. However, when there is either the lift bond or the missing wire in the BGA package, the package will not send the current. The wire bonding result checking method of the invention simply achieves the wire bonding result checking operation for the BGA packages and improves the wire bonding result checking effect in comparison with the typical visual checking method for the BGA package, and improves the productivity and operational reliability of the BGA packages.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for checking a wire bond of a ball grid array semiconductor chip package comprising the steps of:

providing a printed circuit board including leads, a semiconductor chip, a probe, and a capillary of a wire bonding checking system;

forming an electroconductive metal layer on a chip bonding portion of the printed circuit board of the chip package as well as on a passage extending between the chip bonding portion and on a gate, said gate being provided on the printed circuit board for letting a molded housing of the chip package be readily separated from molds after molding a package housing using a compound resin;

bonding the chip to the chip bonding portion;

interconnecting the leads and wire bonding portions of the chip by wire bonds;

contacting the probe and the capillary of the wire bonding checking system to said gate and to a wire bonding portion of the semiconductor chip, respectively; and sending an electric current to the semiconductor chip wire bonding portion from the checking system and checking whether the semiconductor package sends the electric current therethrough.

2. The method according to claim 1, wherein said electroconductive metal layer is a gold layer.

3. The method according to claim 1, wherein said electroconductive metal layer is a copper layer.

4. The method according to claim 1, wherein said PCB is a single-layered PCB.

5. The method according to claim 1, wherein said PCB is a multi-layered PCB.

6. The method according to claim 5, wherein said multi-layered PCB includes a blind via.

7. The method according to claim 5, wherein said multi-layered PCB includes a buried via.

8. The method according to claim 5, wherein said multi-layered PCB includes a through hole.

* * * * *